(12) United States Patent
Pouydebasque et al.

(10) Patent No.: US 7,923,315 B2
(45) Date of Patent: Apr. 12, 2011

(54) MANUFACTURING METHOD FOR PLANAR INDEPENDENT-GATE OR GATE-ALL-AROUND TRANSISTORS

(75) Inventors: Arnaud Pouydebasque, Gieres (FR); Philippe Coronel, Barraux (FR); Stephanne Denorme, Crolles (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/809,876

(22) PCT Filed: Dec. 18, 2008

(86) PCT No.: PCT/IB2008/055418
§ 371 (c)(1),
(2), (4) Date: Sep. 22, 2010

(87) PCT Pub. No.: WO2009/081345
PCT Pub. Date: Jul. 2, 2009

(65) Prior Publication Data
US 2011/0014769 A1      Jan. 20, 2011

(30) Foreign Application Priority Data
Dec. 21, 2007   (EP) ..................................... 07291587

(51) Int. Cl.
*H01L 21/00* (2006.01)
*H01L 21/84* (2006.01)

(52) U.S. Cl. ........ 438/157; 438/176; 438/195; 438/283; 438/588; 257/E21.179

(58) Field of Classification Search .................. 438/165, 438/283, 157, 176, 588; 257/E21.179
See application file for complete search history.

(56) References Cited

U.S. PATENT DOCUMENTS

| | | | |
|---|---|---|---|
| 5,583,362 A * | 12/1996 | Maegawa | 257/347 |
| 5,965,914 A * | 10/1999 | Miyamoto | 257/331 |
| 7,002,207 B2 * | 2/2006 | Kim et al. | 257/331 |
| 7,800,172 B2 * | 9/2010 | Lee et al. | 257/331 |
| 2004/0124468 A1 * | 7/2004 | Coronel et al. | 257/347 |
| 2004/0262690 A1 * | 12/2004 | Coronel et al. | 257/365 |
| 2009/0212330 A1 * | 8/2009 | Bernard et al. | 257/256 |

* cited by examiner

Primary Examiner — Jarrett J Stark

(57) ABSTRACT

The present invention relates to a method for fabricating a planar independent-double-gate FET or a planar gate-all-around FET on a bulk semiconductor substrate. The method comprises refilling a surface recess in an active semiconductor region with a buried sacrificial layer, and, after preparing a pre-processing a gate stack by respective deposition and patterning, the formation of a recess in the isolation regions so as to cause the recess to extend, in a depth direction that points towards the inner substrate, to a depth level that allows removing the buried sacrificial layer and so as to cause the recess to undercut portions of gate stack in the channel direction.

12 Claims, 8 Drawing Sheets

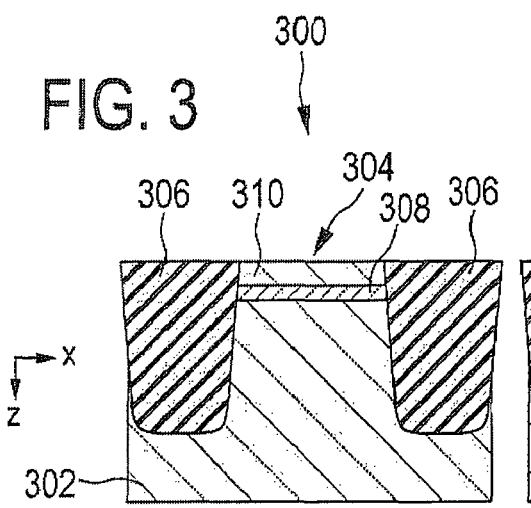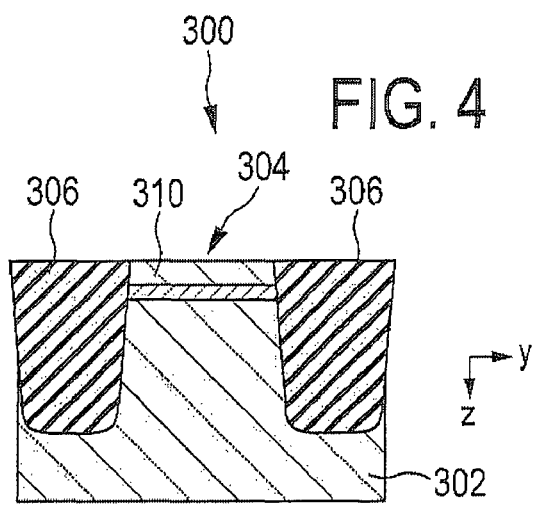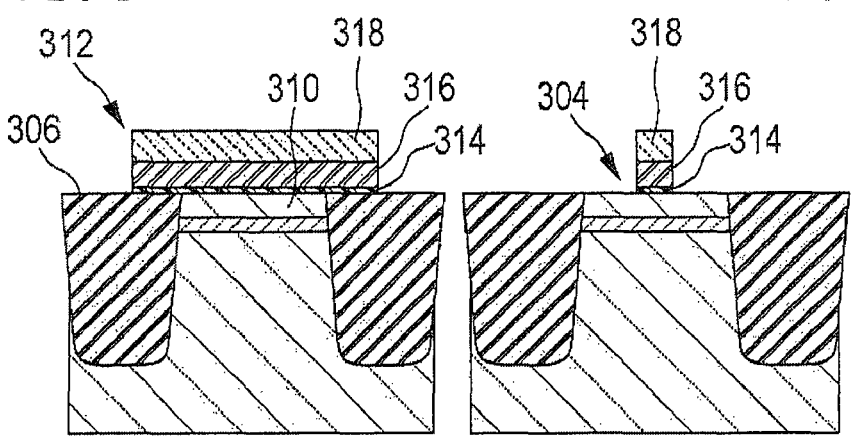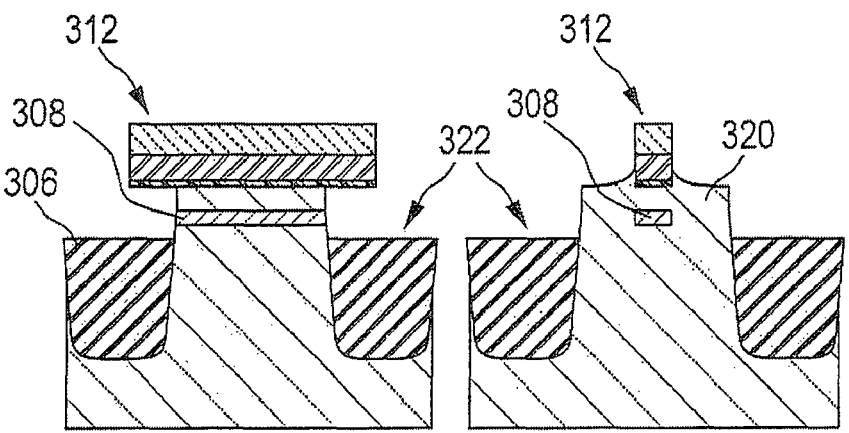

FIG. 9
FIG. 10
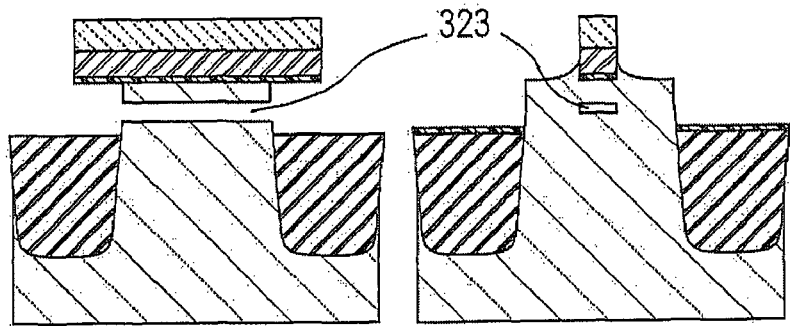
FIG. 11
FIG. 12
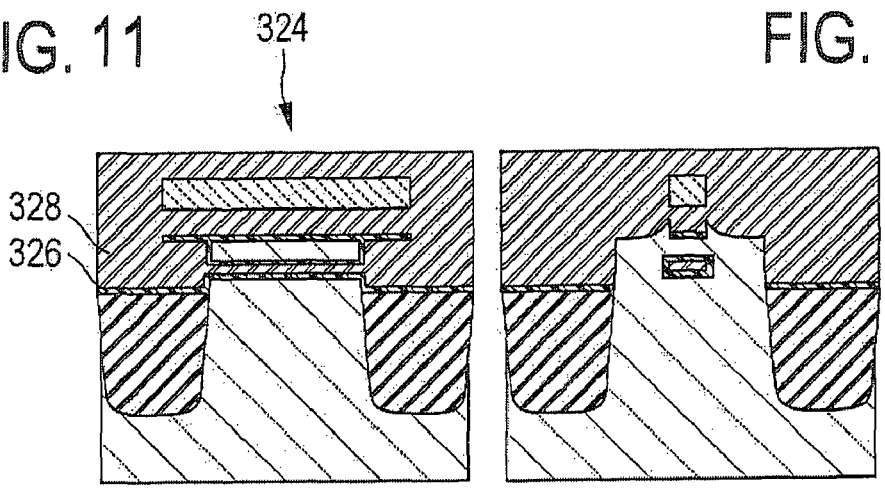
FIG. 13
FIG. 14
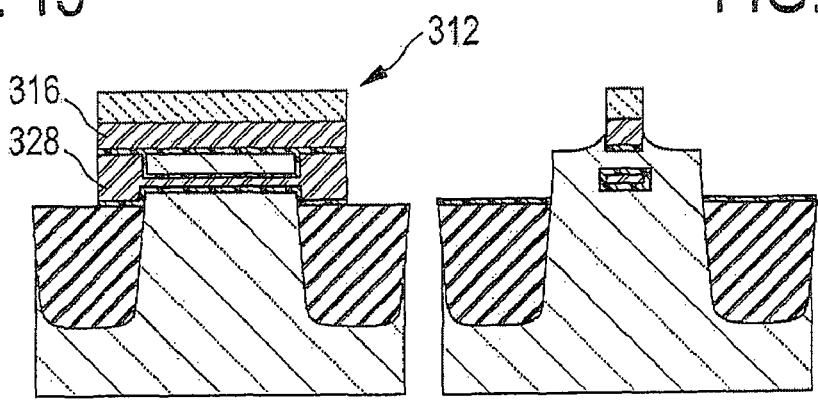

FIG. 27
FIG. 28
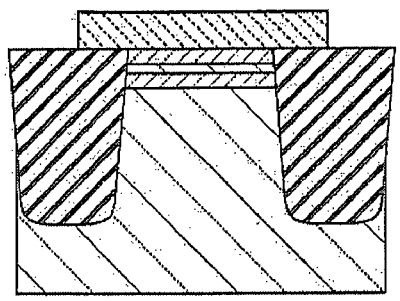
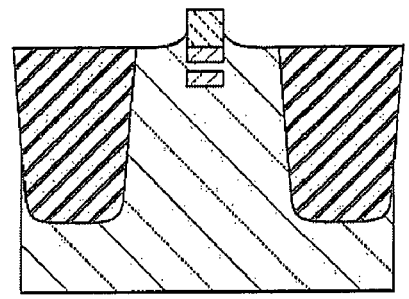
FIG. 29
FIG. 30
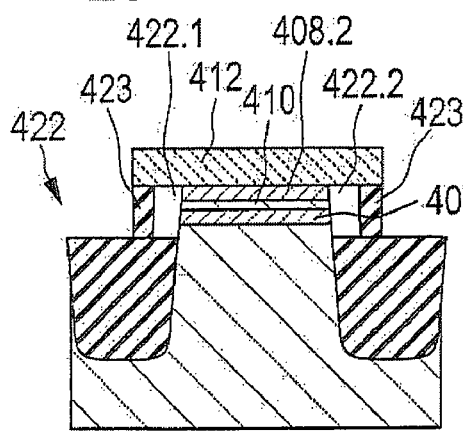
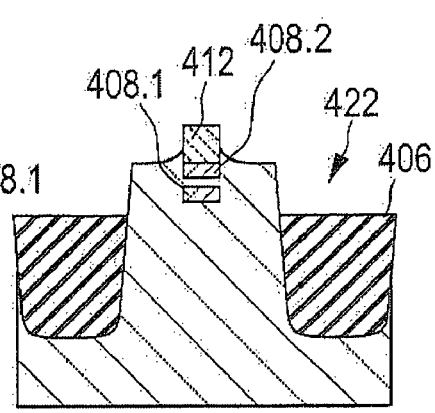
FIG. 31
FIG. 32
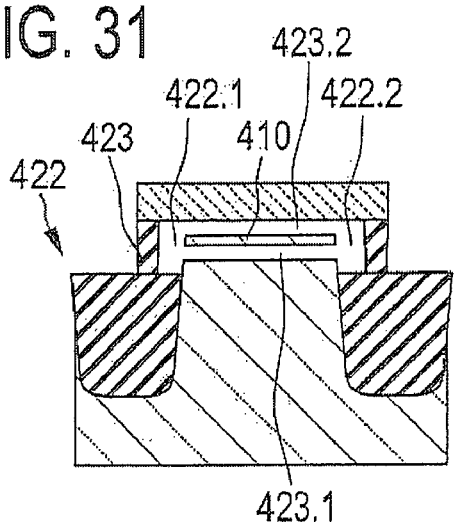
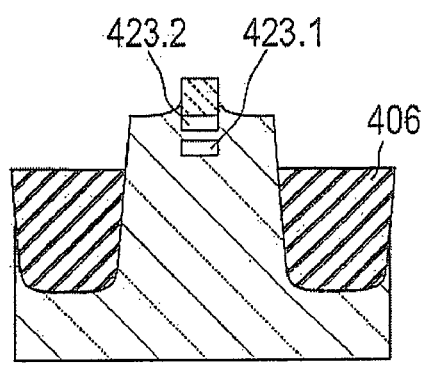

FIG. 39
FIG. 40
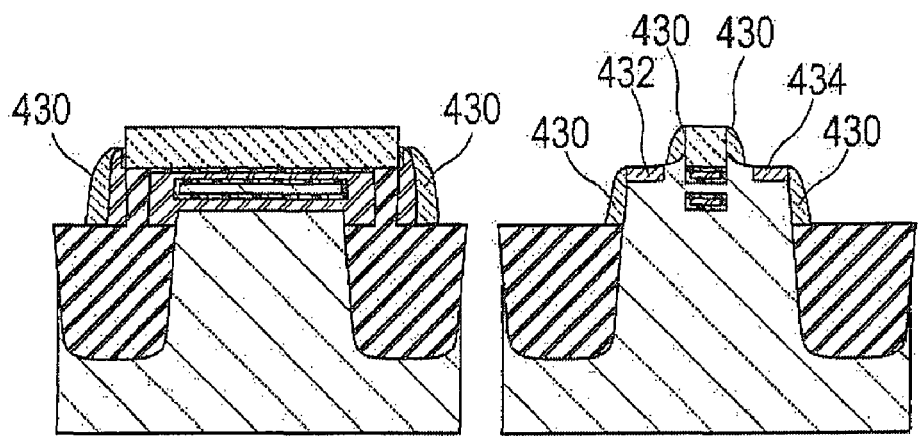
FIG. 41
FIG. 42
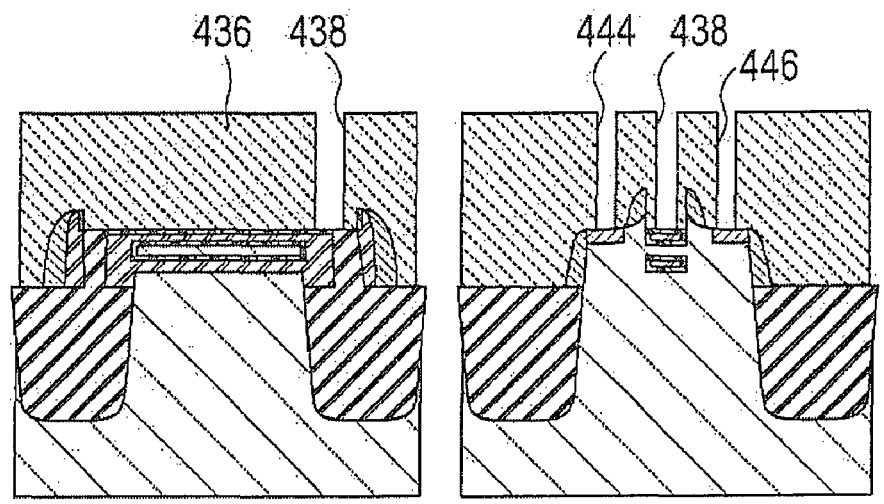

US 7,923,315 B2

MANUFACTURING METHOD FOR PLANAR INDEPENDENT-GATE OR GATE-ALL-AROUND TRANSISTORS

FIELD OF THE INVENTION

The present invention relates to a method for manufacturing a planar independent-gate field effect transistor (IDG-FET) and to a method for manufacturing a planar gate-all-around field effect transistor (GAAFET).

BACKGROUND OF THE INVENTION

Among the transistor structures favored for use in transistor structures with channel length of 50 nm or less, double gate (DG) or gate-all-around structures are widely considered as the most promising CMOS structures.

Different kinds of such multi-gate structures are envisioned, such as FinFET, vertical structures, or planar structures, according to the orientation of the conduction film and the respective fabrication process.

The planar architecture has the advantage to be able to stack several conduction channels vertically, i.e., to keep the same layout density as a bulk planar architecture, but to accommodate a higher current in comparison with the planar architecture. Inversely, it is also possible to reach the same current level in an integrated circuit with a much higher layout density.

FinFET devices have the disadvantage that they have a higher access resistance and a degraded NMOS mobility for (110) fin surfaces. Furthermore, problems arise in dopant implantation due to the shadowing effect. It has also proven difficult to reliably form fins with channel lengths below 20 nm.

US 2004/026290 A1 describes a process for fabricating a gate-all-around MOS transistor comprising one or several thin channels. The process disclosed in this document involves forming an insulating wall protruding from a substrate surface at a periphery of an active area of the silicon substrate. Subsequently, layer pairs are stacked.

Each pair comprises a silicon single-crystalline layer and a layer of a material, which is selectively etchable with respect to silicon. Subsequently, a strip of a material, which is selectively etchable with respect to silicon is formed above the previously deposited stack and the insulating walls, substantially above a central strip of the active area. The layer stack is then anisotropically etched on both sides of the strip and replaced by epitaxially grown silicon. A protection layer of a material different from that of this strip, the insulating walls end of the stack is then formed. After that, the strip is removed and the insulating walls, which are not protected by the protection layer are etched down the bottom of the layer stack.

Then, those layers, which are made of the material selectively etchable with respect to silicon are removed and a thin silicon oxide layer is formed at the surface of the silicon areas. Finally, the remaining cavity is filled with a conductive material that functions as the gate during operation of the transistor.

The process described in US 2007/026290 A1 is a single damascene approach. It is rather complex, which makes processing and the resulting devices expensive.

It would therefore be desirable to provide a more efficient fabrication process for a multi-gate FET.

It would also be desirable to provide a process that with only slight modifications can be used for the fabrication of a planar independent-gate FET or for the fabrication of a gate-all-around FET, or for a co-integration of single-gate FETs and planar independent-gate or gate-all-around FETs.

SUMMARY OF THE INVENTION

According to a first aspect of the invention, a method is provided for fabricating a planar independent-double-gate (IDG)FET on a bulk semiconductor substrate. The method comprises:

a) providing a substrate with an active semiconductor region laterally defined by an isolation region and with a sacrificial layer buried under a semiconductor layer;

b) depositing a first gate-dielectric layer and a first gate layer, and depositing a hard mask layer on the first gate layer;

c) laterally trimming the first gate-dielectric layer and the first gate layer in a stripe shape so as to cause them to extend, in a channel direction (x) pointing along the longitudinal direction of the FET channels, not only in the active semiconductor region but also on portions of the isolation region;

d) fabricating source and drain regions;

e) fabricating a recess in the isolation region so as to cause the recess to extend, in a depth direction that points towards the inner substrate, to a depth level that provides a lateral access for an etching agent to the buried sacrificial layer and so as to cause the recess to undercut portions of the first gate stack in the channel direction;

f) selectively removing the buried sacrificial layer with the etching agent, thus forming a tunnel with semiconductor tunnel walls in place of the buried sacrificial layer;

g) depositing a second dielectric layer and a second gate layer in the recess and on the semiconductor tunnel walls, thus completing a gate-stack;

h) laterally trimming the gate stack so as to separate top and bottom gate layers.

The method of the present invention allows fabricating a planar IDGFET on a bulk or silicon-on-insulator (SOI) semiconductor substrate with a technologically well controllable and, in that sense, simple process. In comparison with known process technologies for IDG FETs, the method of the invention provides the advantage of a simplified processing without compromise in regards to device parameters. The method thus reduces the processing cost and complexity in comparison with known fabrication methods.

The method of the invention does not increase the process complexity in comparison with a bulk CMOS process for the fabrication of FETs. No additional lithography steps are required.

The method is based on the use of a specific sacrificial layer, the buried sacrificial layer in the active semiconductor region. During the later processing a recess is formed in the isolation regions (step e) that extends to a depth level that allows removing the buried sacrificial layer in a subsequent step. A self-aligned formation of the gate structure in the process of the present invention is enabled by the hard mask layer.

The method of the invention allows an optimized control of the channel to avoid short-channel effects in the multi-gate transistor. It is applicable for all known MOS or CMOS devices, such as logic gates, memory cells like static random excess memory (SRAM) and dynamic RAM (DRAM), etc., and their applications.

As in regular use by persons of ordinary skill in the art the term "active semiconductor region" refers to a substrate region of the semiconductor substrate, which is laterally defined by isolation regions such as shallow trench isolations (STI) and used for the placement of circuit elements of an integrated circuit, the term circuit elements including for example, inter alia, transistors.

Note that the use of letters for ordering of steps in the definition of the method of the first aspect of the invention does not imply that the given order is the only one that can be used.

Closely related to the method of the first aspect of the invention by a common concept is a second aspect of the invention, which concerns a method for fabricating a planar gate-all-around (GAA)FET on a bulk semiconductor substrate. The method of the second aspect of the invention comprises:

a) providing a substrate with an active semiconductor region laterally defined by an isolation region, with a sacrificial layer buried under a semiconductor layer and with a surface sacrificial layer;
b) depositing a hard mask layer;
c) patterning the hard mask layer in a stripe shape so as to cause the hard mask layer to extend, in a channel direction (x) pointing along the longitudinal direction of the FET channels, not only in the active semiconductor region (404) but also on a part of the isolation region;
d) fabricating source and drain regions;
e) fabricating a recess in the isolation region so as to cause the recess to extend, in a depth direction that points towards the inner substrate, to a depth level that provides a lateral access for an etching agent to the buried sacrificial layer and so as to let the recess undercut portions of the hard mask layer in the channel direction;
f) removing the buried sacrificial layer and the surface sacrificial layer, thus forming tunnels with semiconductor tunnel walls in place of the buried and surface sacrificial layers;
g) depositing a gate stack comprising a dielectric layer and a gate layer in the recess and on the semiconductor tunnel walls, thus completing a gate stack; and
h) trimming the gate stack.

The method of the second aspect incorporates the same processing concept as the method of the first aspect of the invention, which processing concept involves a first recess formation in the active semiconductor region for introducing the sacrificial layer(s), a patterning around active and gate regions in the recess, and a second recess formation in the isolation regions to remove the dielectric layer under a gate line area intersection. A minor process difference lies in the use of two sacrificial layers in the active semiconductor region.

In addition to the buried sacrificial layer, a surface sacrificial layer is used to allow depositing the gate stack all around the channel region during later processing. This difference between the methods of the first and second aspects of the invention is owed to the goal of fabricating a GAAFET in the method of the second aspect of the invention instead of an IDGFET, as in the method of the first aspect of the invention.

However, from the above process description it becomes clear that the method of the second aspect of the invention also uses a self-aligned formation of the gate structure enabled by the hard mask layer, and a formation of a recess in the isolation regions that extends to a depth level deeper than the depth of the buried sacrificial layer, thus allowing the removal of the buried sacrificial layer and of the surface sacrificial layer in step f) for subsequent deposition of a gate stack that has a gate line above the level of the isolation regions.

The advantages of the method of the second aspect of the invention therefore correspond to those mentioned for the method of the first aspect of the invention.

Further advantages of the invention will be elucidated in the context of the following description of embodiments of the methods of the first and second aspect of the invention. Unless explicitly restricted to the context of the method of either the first or the second aspect of the invention, the embodiments can be used in the context of both method aspects. Furthermore, the additional features of the embodiments explained in the following can be combined with each other to form additional embodiments, unless certain embodiments are explicitly described as forming alternatives to each other.

Providing the substrate is in one embodiment performed by forming a surface recess in the active semiconductor region and refilling the surface recess with the sacrificial layer, which is then buried with the semiconductor material, preferably in an epitaxial deposition process.

In order to obtain a good selectivity in the process of removing the sacrificial layer(s) with respect to neighboring layers of other materials, a layer combination has proven suitable, in which the material of the semiconductor substrate and of the semiconductor material covering the buried sacrificial layer is silicon Si, and the material of the buried sacrificial layer is silicon-germanium SiGe, for instance having 30% Germanium, i.e., $Si_{0.7}Ge_{0.3}$. In the method of the second aspect of the invention, also the material of the surface sacrificial layer is preferably silicon-germanium. An advantage of this material combination is that it is fully based on materials, which are in common use in existing front-end technologies. This material choice allows a fabrication of source and drain regions in step d) by a junction etch, followed by Si epitaxy. With these operations the buried sacrificial layer (SiGe film) can be arranged with respect to the gate in a self-aligned mode.

In one embodiment of the methods of both aspects of the invention, the hard mask layer is made of a dielectric material that is also used for depositing a pre-metal dielectric after forming the lateral spacers, and wherein the hard mask layer is retained throughout the processing and then embedded into the pre-metal dielectric. This embodiment further simplifies the processing.

A separation of the top and bottom gate layers in the IDGFET processing of the method of the first aspect of the invention preferably comprises performing an overetch in the trimming of the gate stack (step h). The trimming is in one embodiment performed by an etchback etch using a prior lithographical definition in the gate patterning (trimming) process c).

Suitably, lateral spacers are fabricated on the sidewalls of the patterned gate stack in respective embodiments of the methods of both aspects of the invention. The fabrication of the lateral spacers should be performed after the trimming of the gate stack.

The recess formation in the isolation regions in step e) of the method of the first aspect of the invention is in one embodiment performed using an isotropic etching process. The isolation regions are thus exposed to an etching agent suitable for an isotropic etching process. In another embodiment, the isolation regions are formed suing a shallow-trench isolation (STI) technique. The isolation regions may for instance be formed of $SiO_2$.

However, a combination of isolation materials is also possible. For instance, a stacked STI isolation may suitably comprise at the trench bottom a first silicon oxide layer, an intermediate silicon nitride layer on the first silicon oxide layer, and a second silicon dioxide layer on top of the silicon nitride layer. Such layered structures have advantageous properties with respect to stress generation in the neighboring substrate regions. In this embodiment, the recess formation is performed with best control of the STI removal by a combination of an anisotropic and a subsequent isotropic etching process.

In the method of the second aspect of the invention, providing the substrate comprises in one embodiment forming a surface recess in the active semiconductor region and refilling the recess with a sacrificial layer, which is buried with the semiconductor layer and with the surface sacrificial layer.

The use of the surface sacrificial layer requires providing a support for the hard mask layer after removal of the surface sacrificial layer. This can be accomplished in one embodiment in the formation of the recess in the isolation regions by using an exposure of the isolation regions to an etching agent that is suitable for a predominantly, but not fully isotropic etching process, so as to cause a pillar of insulator material of the isolation region to remain at lateral edges of the hard mask layer at the end of the process of forming a recess.

This embodiment is preferably combined with the previously mentioned processing, which uses a hard mask layer of a dielectric material that is also used for depositing the pre-metal dielectric. The STI-etching is suppressed only under the region, where the gate has the lowest lateral extension perpendicular to the lateral direction pointing from the source region to the drain region of the transistor.

A further advantage of the present invention is that the methods of both aspects of the invention can be easily combined with a (concurrent) fabrication of a planar bulk FET in a second active semiconductor region different from the active semiconductor region, in which the IDGFET or the GAAFET is fabricated. In order to achieve concurrent fabrication with a planar bulk FET, the method steps of the method of the first aspect of the invention (claim 1) are also performed in the second active semiconductor region with the following exceptions:

the (second) active regions used for the planar bulk FET are provided without a sacrificial layer;
steps e) and f) of the method of the first or second aspect of the invention are not applied in the second active semiconductor region.

In one embodiment, step d) of the method of the first aspect of the invention is additionally performed in a manner adapted for the fabrication of a planar bulk FET in the second active semiconductor region.

Therefore, a co-integration of a planar IDGFET or a planar GAAFET with standard bulk FETs fits well into the basic processing scheme of the present invention.

It is further possible to combine the fabrication of the IDGFET with the fabrication of the GAAFET by combining the methods of the first and second aspects of the invention. To this end, the respective steps a) to h) of the methods of the first and second aspects of the invention are performed concurrently. That means, at first the respective steps a) of the methods of the first and second aspects of the invention are performed concurrently, subsequently the respective steps b) of both methods are performed concurrently, and so on. Embodiments of the invention are also defined in the dependent claims.

BRIEF DESCRIPTION OF THE DRAWINGS

These and other aspects of the invention will be apparent from and elucidated with reference to the embodiment(s) described hereinafter. In the following drawings

FIGS. 3 to 20 show cross-sectional views of a planar IDGFET during different stages of its fabrication;

FIGS. 21 to 42 show cross-sectional views of a planar GAAFET during different stages of its fabrication.

DETAILED DESCRIPTION OF EMBODIMENTS

Figure 1:
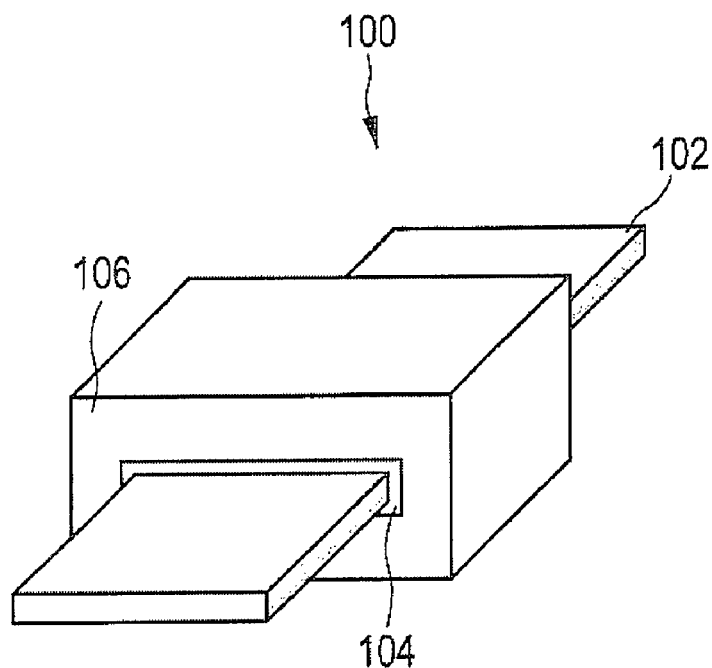
FIGS. 1 and 2 show schematic three-dimensional illustrations of a planar GAAFET and a planar IDGFET.
Figure 2:
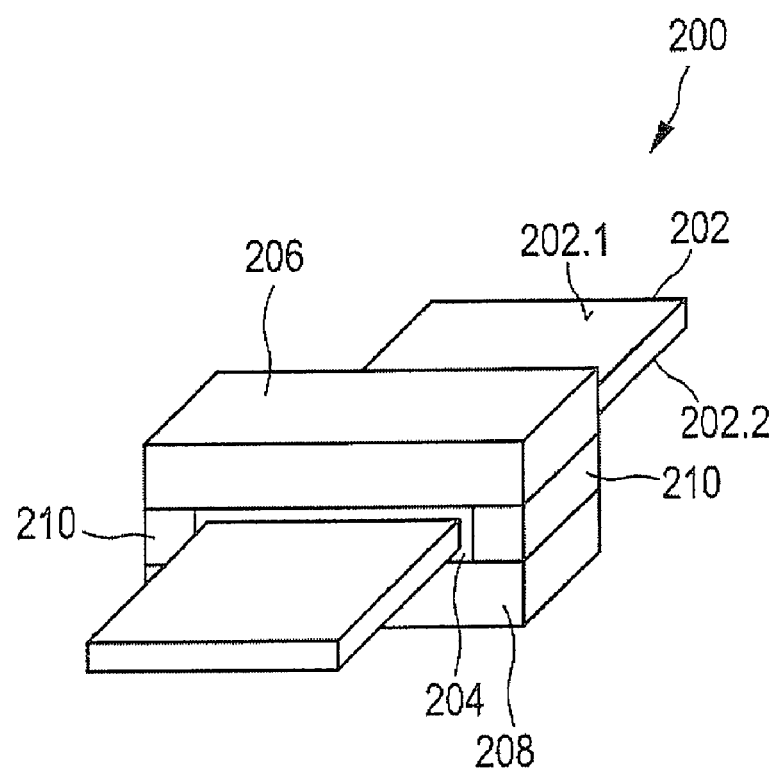

FIGS. 1 and 2 show schematic three-dimensional illustrations of a planar GAAFET and a planar IDGFET. The structures shown in FIGS. 1 and 2 represent general features of a GAAFET and of a IDGFET, which are as such known in the art.

The GAAFET 100 of FIG. 1 has a channel layer 102, which extends between a source region (not shown) and a drain region (not shown). The channel layer is surrounded by a dielectric layer 104 and an electrically conductive gate layer 106. The IDGFET 200 of FIG. 2 has a channel layer 202, which extends between a source region (not shown) and a drain region (not shown). The channel layer 202 is surrounded by a dielectric layer 204. Two main surfaces 202.1 and 202.2 of the channel layer face respective gate layers 206 and 208. The sidewalls of the channel face an insulating layer 210.

FIGS. 3 to 20 show cross-sectional views of a planar IDGFET during different stages of its fabrication. The Figures are grouped in pairs. Each pair of Figures represents a respective processing stage. The Figures with odd numbering show cross-sectional views of the IDGFET of a plane that is parallel to the longitudinal direction of the channel, i.e. parallel to the direction of current flow through the channel layer of the IDGFET. This direction is referred to as x-direction. Figures with even numbering show cross-sectional views of a plane that is perpendicular to the direction of current flow through the channel layer. This direction is referred to as the y-direction. The x- and y-directions are lateral directions, which are perpendicular to each other. A z-direction, which is perpendicular to the lateral x- and y-directions points from an upper substrate surface to a lower substrate surface. The processing is performed on the upper substrate surface.

Referring to FIGS. 3 and 4, a silicon substrate 302 is processed by defining an active region 304, which is also referred to as active area 304 herein. The active area 304 is defined by fabricating shallow trenches and filling the shallow trenches with an insulating material according to known processes, for instance, of shallow-trench isolation (STI). The resulting STI regions are shown under reference label 306. Subsequently, a recess (not shown) is formed in the active areas and filled with a sacrificial layer 308, followed by a fill-up with semiconductor material, which in the present embodiment suitably is a silicon layer 310. A suitable material for the sacrificial layer 310 is SiGe. The filling is suitably performed by epitaxy.

Subsequently, for reaching a processing stage shown in FIGS. 5 and 6, a layer stack 312 is deposited and structured. The layer stack 312 comprises a dielectric layer 314, which is deposited on the substrate surface including the epitaxial silicon layer 310 and the STI 306, followed by the deposition of a gate layer 316 and a hard mask layer 318. The gate layer 316 is suitably made of TiN and polysilicon. However, other materials can be used as suitable gate materials.

The layer stack 312 is structured, or, in other word, trimmed by etching, leaving a stripe-shaped layer stack extending in x-direction over the complete active area 304 and over a part of the shallow-trench isolations 306. In y-direction, the layer stack 312 covers a small section in the center of the active area 304.

Subsequently, for reaching a next intermediate processing stage shown in FIGS. 7 and 8, a source/drain etch is performed, followed by silicon epitaxy in the active semiconductor region 304. The source/drain etch attacks the epitaxial silicon layer 310 and the underlying sacrificial SiGe layer 308 in those sections of the active semiconductor region 304, which are not covered by the layer stack 304. The etched regions are subsequently filled with a epitaxial silicon layer 320.

Furthermore, a recess 322 is formed in the STI isolations 306. The recess 322 extends from the surface of the active semiconductor region to just below the sacrificial layer 308. Next, as shown in FIGS. 9 and 10, the sacrificial SiGe layer 308 is removed by etching.

Subsequently, as shown in FIGS. 11 and 12, a second layer stack 324 is deposited in the recess areas 322 and the cavity 323 left by the previous etching step. The layer stack also covers the first gate stack 312. The second layer stack is made of a second dielectric layer 326 and a second gate layer 328 made of TiN and polysilicon. The dielectric layer 326 covers the cavity faces exposed by the previous etching step.

Subsequently, in order to reach the intermediate processing stage shown in FIGS. 13 and 14, the TiN plus polysilicon layer 328 is etched down to the dielectric layer 326. In this step, an overetch is performed to separate the TiN plus polysilicon layer 316 forming the upper gate layer and the TiN plus polysilicon layer 328, which forms the lower gate layer in the IDGFET to be fabricated. Furthermore, the dielectric layer 326 is removed in surface portions, which are not covered by the first layer stack 312.

Figure 15:
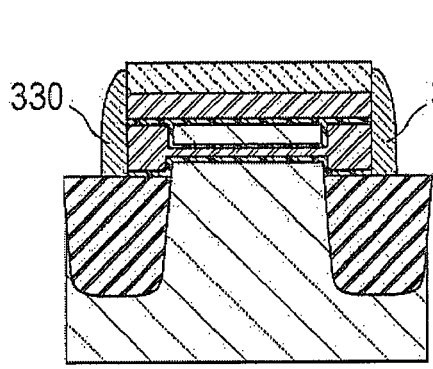
Figure 16:
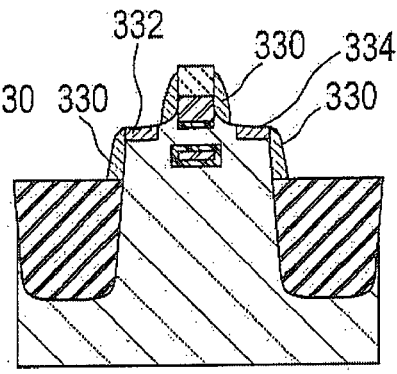

Then, source/drain extension implants are made (not shown), followed by the formation of insulating side wall spacers 330 and the formation of metal silicide layers 332 and 334 for source and drain contacts (FIGS. 15 and 16).

Figure 17:
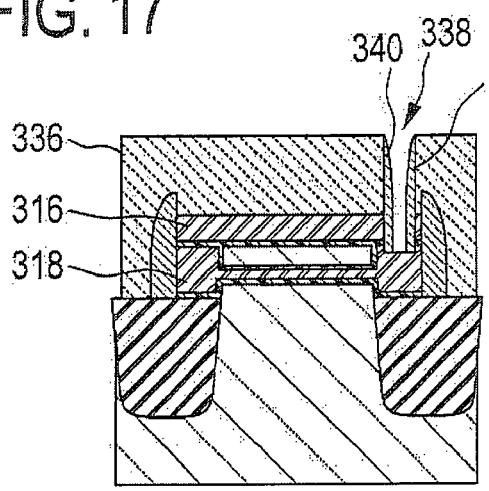
Figure 18:
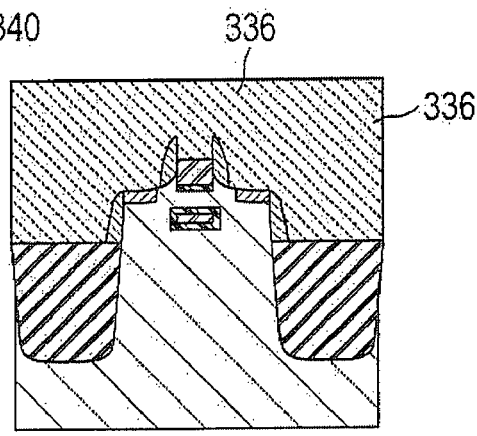

The structure is then covered by a pre-metal dielectric 336. The pre-metal dielectric 336 is structured by photolithography and etching for the formation of a bottom gate contact opening 338, the side walls of which are covered by internal insulating spacers 340 (FIGS. 17 and 18).

Figure 19:
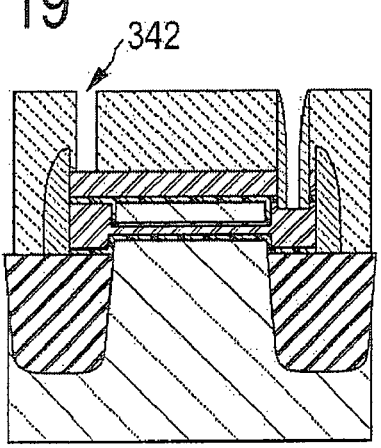
Figure 20:
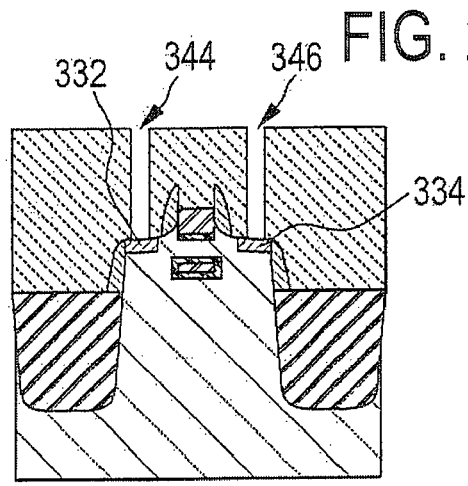

In the next processing stage shown in FIGS. 19 and 20, the top gate layer 316 is contacted by photolithography and etching of the pre-metal dielectric layer 316 to form a contact opening 342. Furthermore, contact openings for source and drain are formed, as indicated by contact openings 344 and 346 in FIG. 20, followed by usual process steps like contact filling etc.

FIGS. 21 to 42 show cross-sectional views of a planar GAAFET during different stages of its fabrication.

The Figures are again grouped in pairs. Each pair of Figures represents a respective processing stage. The Figures with odd numbering are cross-sectional views of the GAAFET of a plane that is parallel to the longitudinal direction of the channel, i.e., parallel to the direction of current flow through the channel layer of the GAAFET. This directions is again referred to as the x-direction. Figures with even numbering show cross-sectional views of a plane that is perpendicular to the direction of current flow through the channel layer of the GAAFET. This direction is referred to a the y-direction. The x- and y-directions are lateral directions, which are perpendicular to each other. A z-direction, which is perpendicular to the lateral x- and y-directions points from an upper substrate surface to a lower substrate surface. The processing is again performed on the upper substrate surface.

Figure 21:
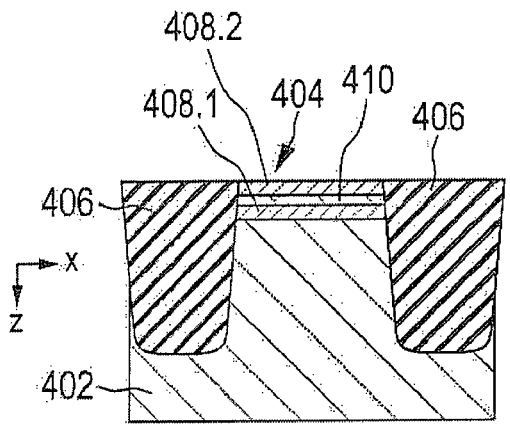
Figure 22:
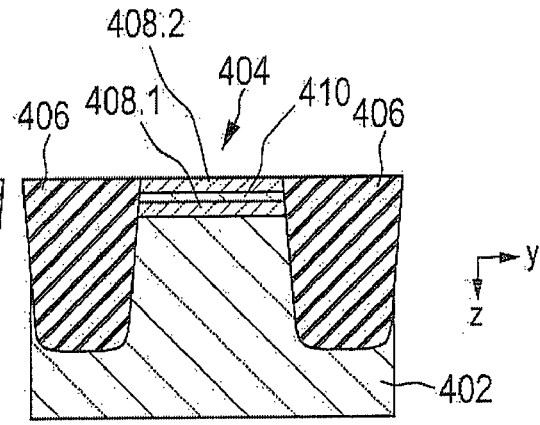

With reference to FIGS. 21 and 22 a silicon substrate 402 is processed by defining an active area 404. The active area 404 is defined by fabricating shallow trenches and filling the shallow trenches with insulating materials, as described for the IDGFET 200 of the previous embodiment with reference to FIGS. 3 and 4. The resulting STI regions remain untouched in a subsequent selective etching step, which forms a recess (not shown) in the active semiconductor region 404. The recess is then filled with an epitaxial layer sequence comprising a first sacrificial layer 408.1, followed by an epitaxial silicon layer 410 and a second sacrificial layer 408.2. A suitable material for the sacrificial layers 408.1 and 408.2 is SiGe.

Figure 23:
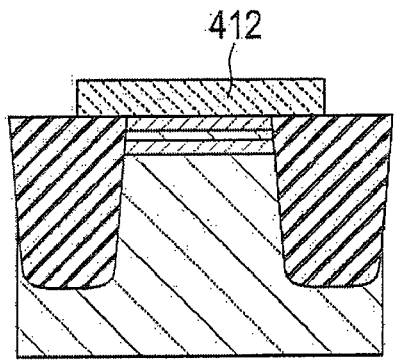
Figure 24:
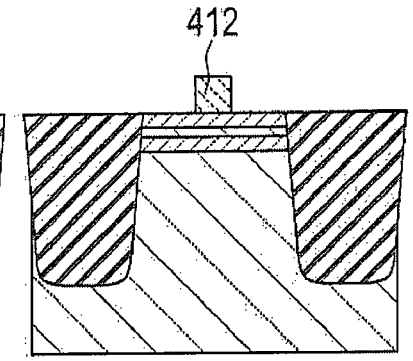
Figure 25:
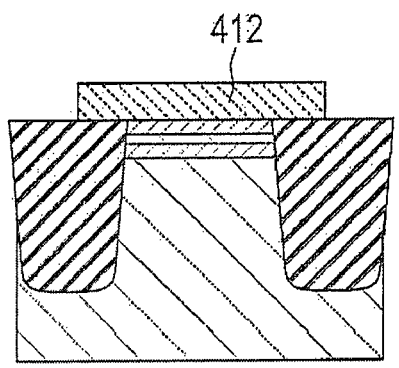
Figure 26:
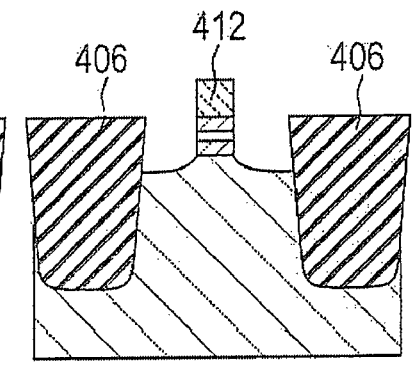

Subsequently, in order to reach an intermediate processing stage that is shown in FIGS. 23 and 24, a hard mask layer 412, hereinafter also referred to as the dummy gate layer 412, is deposited on the substrate surface and then structured. A suitable material for the dummy gate layer is Si3N4. The structured dummy gate layer 412 has a stripe shape that extends in x-direction over the complete active area 404 and over a part of the STI regions 406. In y-direction, the dummy gate layer 412 covers a small section in the center of the active area 404. Subsequently for reaching the intermediate processing stage shown in FIGS. 25 and 26, the layer structure of the two sacrificial layers 408.1 and 408.2 and the intermediate silicon layer 410 is etched in the active semiconductor region to form a stripe-shaped layer stack extending in x-direction over the complete active area 304 and in y-direction underneath the dummy gate layer 412. This removes the sacrificial layers 408.1 and 408.2 an d the intermediate silicon layer 410 from sections of the active semiconductor region 404 that extend in y-direction between the dummy gate layer an the STI regions 406.

This recess in the active semiconductor region 404 is filled with epitaxial silicon, as shown in FIGS. 27 and 28.

Then, an anisotropic etching step combined with a slightly isotropic etching step is performed to remove an upper section of the STI regions. In a first substep, the isolation area around the gate and the active semiconductor region is etched to form a recess.

In a second substep, the STI material is removed isotropically to provide an access to the sacrificial SiGe film. In one processing option, the first substep is performed by plasma etching with C4F8 chemistry under sole application of a bias power. The second substep is performed by plasma etching with C4F8 chemistry as well, but with an adjusted power bias. In a second processing option, the first substep and the second substep are combined in a wet process using HF chemistry. In a third processing option, the plasma and wet processing options just described are combined with each other, for instance such that the first substep is performed by plasma etching and the second substep is performed by wet etching. Recesses 422 thus formed in the STI regions 406 are etched in a manner that leaves pillars 423 of STI material extending in the vertical z-direction from a lower face of the dummy gate layer 412 to the surface of the remaining STI region 406. The pillars 423 are provided only underneath the longitudinal ends of the dummy gate layer 412, such that the recess 422 comprises cavity sections 422.1 and 422.2 between the pillars 423 and the layer stack formed of the sacrificial layers 408.1 and 408.2 and the intermediate silicon layer 410.

The recesses 422 extend in z-direction to a level just underneath the first sacrificial layer 408.1.

In a subsequent step, the sacrificial SiGe layers 408.1 and 408.2 are selectively etched, as shown in FIGS. 31 and 32. This leads to the formation of two "tunnels" 423.1 and 423.2 in place of the previous buried and surface sacrificial layers 408.1 and 408.2, respectively.

Figure 33:
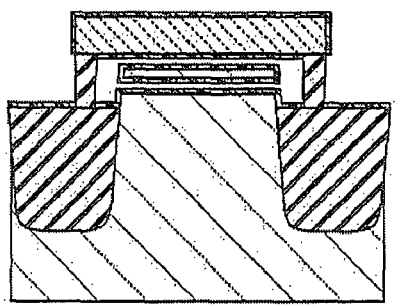
Figure 34:
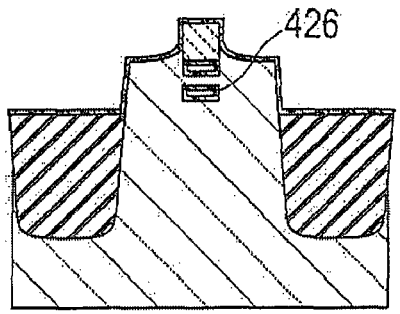

Then, as shown in FIGS. 33 and 34, a dielectric material is deposited for the formation of the gate dielectric layer 426. The gate dielectric layer 426 is deposited on the side walls of the tunnels 423.1 and 423.2 and also on other exposed surface regions of the processed substrate.

Figure 35:
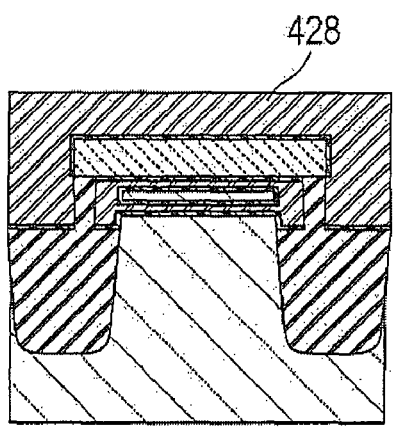
Figure 36:
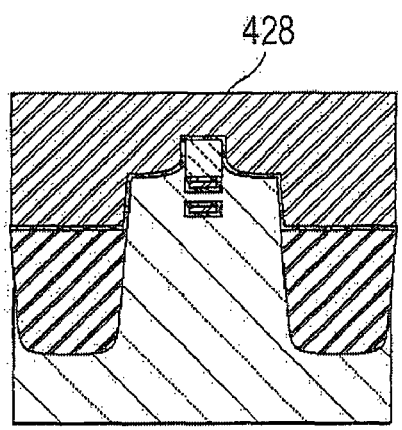
Figure 37:
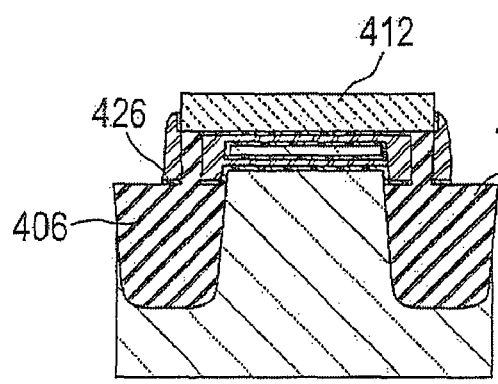
Figure 38:
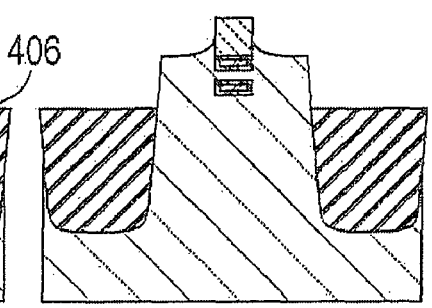

Subsequently, as shown in FIGS. 35 and 36, the gate stack deposition is completed by depositing a TiN+Polysilicon layer combination 428. As previously mentioned, other metal+Poly combinations can the used as well. The gate stack is then patterned in a two-step process. In a first step, the TiN+Poly layer combination 428 is patterned down to the dielectric layer 426. Subsequently, the dielectric layer 426 is selectively etched from all regents not covered any more by the TiN+Poly layer 428. In particular, it is removed on sections of the STI regions 406 and from the upper surface of the dummy gate layer 412.

Then, source/drain extension implants are made (not shown) followed by the formation of insulating side wall spacers 430 and the formation of metal silicide layers 432 and 434 for source and drain contacts (FIGS. 39 and 40).

The structure is then covered with a pre-metal dielectric 436. The pre-metal dielectric 436 is subsequently structured by photolithography and etching for the formation of a gate contact opening 438. Furthermore, contact openings for source and drain are formed as indicated by contact opening 444 in FIG. 42. the subsequent processing involves usual process steps like contact filling etc.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Any reference signs in the claims should not be construed as limiting the scope.

The invention claimed is:

1. A method for fabricating a planar independent-double-gate FET on a bulk semiconductor substrate, the method comprising:
   a) providing a substrate with an active semiconductor region laterally defined by an isolation region and with a sacrificial layer buried under a semiconductor layer;
   b) depositing a first gate-dielectric layer and a first gate layer, and depositing a hard mask layer on the first gate layer;
   c) laterally trimming the first gate-dielectric layer and the first gate layer in a stripe shape so as to cause them to extend, in a channel direction pointing along the longitudinal direction of the FET channels, not only in the active semiconductor region but also on portions of the isolation region;
   d) fabricating source and drain regions;
   e) fabricating a recess in the isolation region so as to cause the recess to extend, in a depth direction that points towards the inner substrate, to a depth level that provides a lateral access for an etching agent to the buried sacrificial layer and so as to cause the recess to undercut portions of the first gate stack in the channel direction;
   f) selectively removing the buried sacrificial layer with the etching agent, thus forming a tunnel with semiconductor tunnel walls in place of the buried sacrificial layer;
   g) depositing a second dielectric layer and a second gate layer in the recess and on the semiconductor tunnel walls, thus completing a gate-stack;
   h) laterally trimming the gate stack so as to separate top and bottom gate layers.

2. A method for fabricating a planar gate-all-around FET on a bulk semiconductor substrate, the method comprising:
   a) providing a substrate with an active semiconductor region laterally defined by an isolation region, with a sacrificial layer buried under a semiconductor layer and with a surface sacrificial layer;
   b) depositing a hard mask layer;
   c) patterning the hard mask layer in a stripe shape so as to cause the hard mask layer to extend, in a channel direction pointing along the longitudinal direction of the FET channels, not only in the active semiconductor region but also on a part of the isolation region;
   d) fabricating source and drain regions;
   e) fabricating a recess in the isolation region so as to cause the recess to extend, in a depth direction that points towards the inner substrate, to a depth level that provides a lateral access for an etching agent to the buried sacrificial layer and so as to let the recess undercut portions of the hard mask layer in the channel direction;
   f) removing the buried sacrificial layer and the surface sacrificial layer, thus forming tunnels with semiconductor tunnel walls in place of the buried and surface sacrificial layers;
   g) depositing a gate stack comprising a dielectric layer and a gate layer in the recess and on the semiconductor tunnel walls, thus completing a gate stack; and
   h) trimming the gate stack.

3. The method of claim 1, wherein the material of the semiconductor substrate and of the semiconductor layer covering the buried sacrificial layer is silicon, and wherein the material of the buried sacrificial layer is silicon-germanium.

4. The method of claim 2, wherein the material of the semiconductor substrate and of the semiconductor layer covering the buried sacrificial layer is silicon, and wherein the material of the buried sacrificial layer and of the surface sacrificial layer is silicon-germanium.

5. The method of claim 1, wherein the hard mask layer is made of a dielectric material that is also used for depositing a pre-metal dielectric layer after trimming the gate stack, and wherein the hard mask layer is retained throughout the processing and then embedded into the pre-metal dielectric.

6. The method of claim 1, wherein trimming the gate stack comprises performing an overetch to separate the top and bottom gate layers.

7. The method of claim 1, wherein forming a recess in the isolation region comprises exposing the isolation region to an etching agent suitable for an isotropic etching process.

8. The method of claim 2, wherein forming a recess in the isolation region comprises exposing the isolation region to an etching agent suitable for a predominantly but not fully anisotropic etching process so as to cause a pillar of insulator material of the isolation region to remain at the lateral edges of the hard mask layer at the end of the process of forming the recess, which pillar is used for supporting the hard mask layer after removal of the surface sacrificial layer.

9. The method of claim 1, wherein a planar bulk FET is concurrently fabricated in a second active semiconductor region by performing the method steps of claim 1 also in the second active semiconductor region, with the exception that
   the second active region used for the planar bulk FET is provided without a sacrificial layer;
   steps e) and f) of the method of claim 1 are not applied in the second active semiconductor region.

10. The method of claim 2, wherein the hard mask layer is made of a dielectric material that is also used for depositing a pre-metal dielectric layer after trimming the gate stack, and wherein the hard mask layer is retained throughout the processing and then embedded into the pre-metal dielectric.

11. The method of claim 2, wherein a planar bulk FET is concurrently fabricated in a second active semiconductor region by performing the method steps of claim 1 also in the second active semiconductor region, with the exception that
  the second active region used for the planar bulk FET is provided without a sacrificial layer;
  steps e) and f) of the method of claim 1 are not applied in the second active semiconductor region.

12. A method for fabricating a planar independent-double-gate FET and a planar gate-all-around FET on a bulk semiconductor substrate, comprising:
  fabricating the planar independent-double gate-FET according to a method, comprising,
    1a) providing a substrate-with an active semiconductor region-laterally defined by an isolation region and with a sacrificial layer-buried under a semiconductor layer;
    1b) depositing a first gate-dielectric layer-and a first gate layer, and depositing a hard mask layer on the first gate layer;
    1c) laterally trimming the first gate-dielectric layer and the first gate layer in a stripe shape so as to cause them to extend, in a channel direction-pointing along the longitudinal direction of the FET channels, not only in the active semiconductor region-but also on portions of the isolation region;
    1d) fabricating source and drain regions;
    1e) fabricating a recess in the isolation region so as to cause the recess to extend, in a depth direction that points towards the inner substrate, to a depth level that provides a lateral access for an etching agent to the buried sacrificial layer and so as to cause the recess to undercut portions of the first gate stack in the channel direction;
    1f) selectively removing the buried sacrificial layer with the etching agent, thus forming a tunnel with semiconductor tunnel walls in place of the buried sacrificial layer;
    1g) depositing a second dielectric layer and a second gate layer in the recess and on the semiconductor tunnel walls, thus completing a gate-stack;
    1h) laterally trimming the gate stack so as to separate top and bottom gate layers; and
  fabricating the planer gate-all-around FET according to a method comprising,
    2a) providing a substrate-with an active semiconductor region -laterally defined by an isolation region, with a sacrificial layer buried under a semiconductor layer and with a surface sacrificial layer;
    2b) depositing a hard mask layer;
    2c) patterning the hard mask layer in a stripe shape so as to cause the hard mask layer to extend, in a channel direction pointing along the longitudinal direction of the FET channels, not only in the active semiconductor region but also on a part of the isolation region;
    2d) fabricating source and drain regions;
    2e) fabricating a recess in the isolation region so as to cause the recess to extend, in a depth direction that points towards the inner substrate, to a depth level that provides a lateral access for an etching agent to the buried sacrificial layer and so as to let the recess undercut portions of the hard mask layer in the channel direction;
    2f) removing the buried sacrificial layer-and the surface sacrificial layer, thus forming tunnels with semiconductor tunnel walls in place of the buried and surface sacrificial layers;
    2g) depositing a gate stack comprising a dielectric layer and a gate layer in the recess and on the semiconductor tunnel walls, thus completing a gate stack; and
    2h) trimming the gate stack.

* * * * *